United States Patent
jenq

[19]

[11] Patent Number: 6,140,176
[45] Date of Patent: Oct. 31, 2000

[54] METHOD AND FABRICATING A SELF-ALIGNED NODE CONTACT WINDOW

[75] Inventor: J. S. Jason jenq, Pingtung, Taiwan

[73] Assignee: United Microelectronics Corp., Hsinchu, Taiwan

[21] Appl. No.: 09/181,274

[22] Filed: Oct. 28, 1998

[51] Int. Cl.7 ............................................. H01L 21/8242
[52] U.S. Cl. ..................... 438/253; 438/254; 438/396; 438/246
[58] Field of Search .................... 438/253, 254, 438/396, 246

[56] References Cited

U.S. PATENT DOCUMENTS

| | | | |
|---|---|---|---|
| 5,422,315 | 6/1995 | Kobayashi | 437/228 |
| 5,466,637 | 11/1995 | Kim | 437/187 |
| 5,946,568 | 8/1999 | Hsiao et al. | 438/253 |

Primary Examiner—Richard Elms
Assistant Examiner—Pho Luu
Attorney, Agent, or Firm—Thomas, Kayden, Horstemeyer & Risley

[57] ABSTRACT

A method of fabricating a self-aligned node contact window starts by forming a bit line on a substrate having a transistor, in which the transistor includes a first source/drain region and a second source/drain region. The bit line is coupled electrically with the first source/drain region of the transistor and there is a cap layer and a first conductive layer formed on the bit line. An insulating layer that is conformal with the bit line, the cap layer and the first conductive layer is formed to serve as an etching stop layer for subsequently forming a conductive spacer. A conductive spacer is formed on the insulating layer of the sidewall of the bit line, the cap layer and the first conductive layer. Using the first conductive layer and the conductive spacer as a mask, an etching process is performed to form a self-aligned node contact window and the second source/drain is thus exposed.

13 Claims, 4 Drawing Sheets

METHOD AND FABRICATING A SELF-ALIGNED NODE CONTACT WINDOW

BACKGROUND OF THE INVENTION

1. Field of the Invention

The invention relates to a method of fabricating a dynamic random access memory (DRAM), and more particularly to a method of fabricating a self-aligned node contact window.

2. Description of the Related Art

As semiconductor device integration increases, device dimensions need to reduce in accordance with the design rule. The line width of the node contact is also reduced as the dimensions of a DRAM capacitor decrease. Therefore, using conventional photolithography to pattern the node contact becomes more and more difficult. If the pattern of the node contact window is misaligned, the position of the node contact window shifts. The quality of the device becomes worse and shorts easily occur in the device.

FIG. 1 is a cross-sectional view of a node contact. A DRAM is formed on an active region defined by the isolation region 101 on the surface of the substrate 100. The field effect transistor (FET) 102 includes a gate structure 103 and a source/drain region 104, 105. The gate structure 103 also includes a cap layer 109 formed thereon and a spacer 110 formed on the sidewall. An insulating layer 112 is formed over the substrate 100 and a self-aligned contact 114 is next formed by patterning the insulating layer. A conductive layer is deposited and defined to form a bit line 122 of the DRAM, such that the bit line 122 is electrically coupled with the source/drain region 104 of the transistor 102.

A layer of silicon oxide 126 is deposited over the substrate 100 and a layer of BPSG 128 is then formed and planarized on the silicon oxide layer 126. These layers of BPSG 128 and silicon oxide 126 are patterned to form a node contact window 134. A capacitor is next formed but it is not necessary to describe here the detailed process of the formation of the capacitor since it doesn't belong to the field of the invention.

However, as line width is reduced, it becomes more difficult to form the node contact window 134 of the capacitor by patterning the BPSG 128 and silicon oxide 126 using photolithography. If a misalignment occurs in the pattern of the node contact window, its position shifts and the bit line 122 is damaged by etching, thus short occurs between the conductive material subsequently deposited in the node contact window and the bit line 122.

SUMMARY OF THE INVENTION

It is therefore an object of the invention to provide a method of fabricating a node contact window that is suitable for highly integrated DRAM devices. In addition, the bit line is protected from being damaged while the node contact window is formed by etching the dielectric layer.

To achieve these objects and advantages, and in accordance with the purpose of the invention, as embodied and broadly described herein, the invention is directed towards a method of fabricating a self-aligned node contact window. A bit line is formed on a substrate having a transistor, in which the transistor includes a first source/drain region and a second source/drain region. The bit line is coupled electrically with the first source/drain region of the transistor and there is a cap layer and a first conductive layer formed on the bit line. An insulating layer that is conformal with the bit line, the cap layer and the first conductive layer are formed to serve as an etching stop layer for subsequently forming a conductive spacer. A conductive spacer is formed on the insulating layer of the sidewall of the bit line, the cap layer and the first conductive layer. Using the first conductive layer and the conductive spacer as a mask, an etching process is performed to form a self-aligned node contact window and expose the second source/drain region.

It is to be understood that both the foregoing general description and the following detailed description are exemplary and explanatory only and are not restrictive of the invention, as claimed.

DESCRIPTION OF THE PREFERRED EMBODIMENTS

Figure 1:
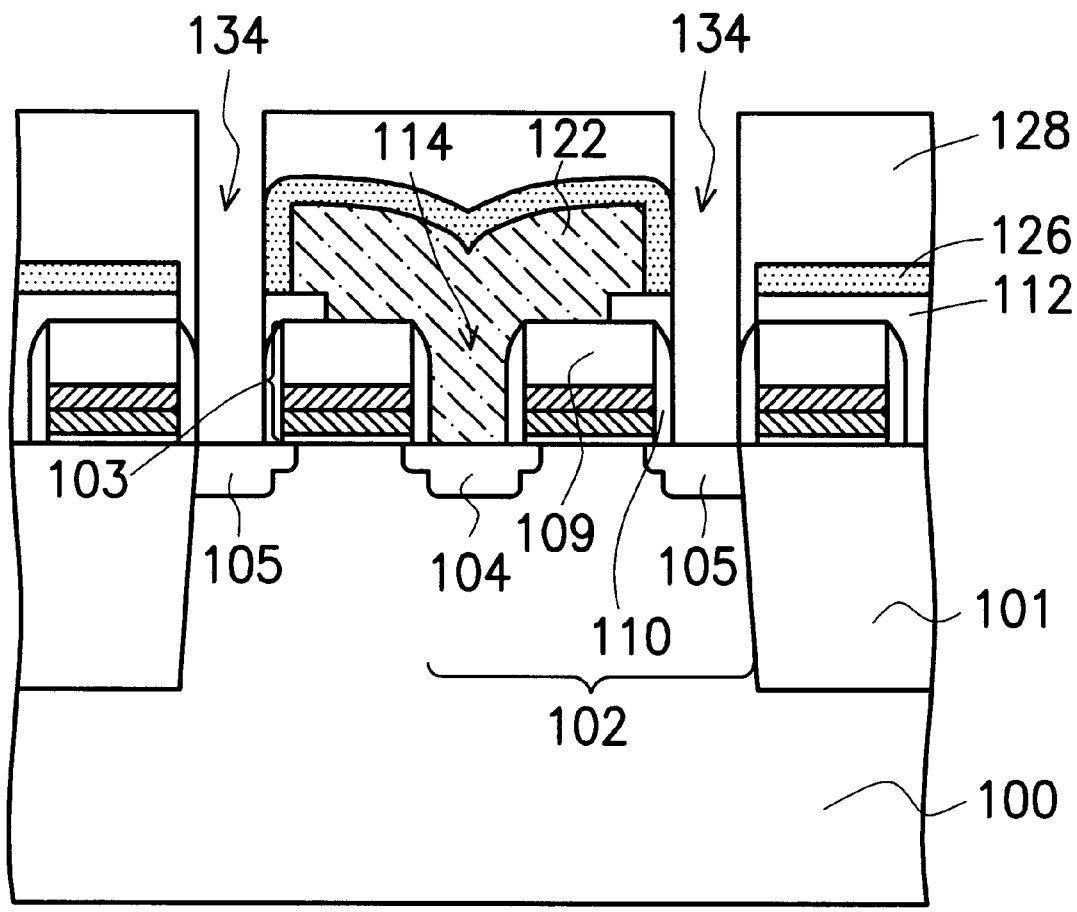
FIG. 1 is a cross-sectional view illustrating the fabrication of a node contact in the prior art.
Figure 2A:
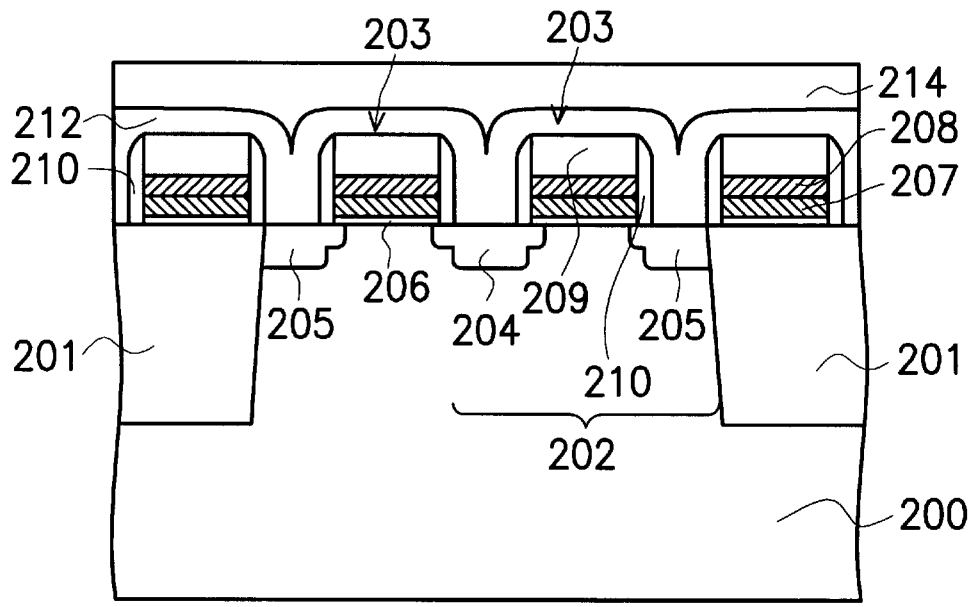
FIGS. 2A–2E are cross-sectional views illustrating the fabrication of a DRAM capacitor in accordance with a preferred embodiment of the invention.

Referring to FIG. 2A, an isolation region 201, such as field oxide, shallow trench isolation (STI) or the like is formed in a substrate 200 and used to define an active region. The substrate 200 is usually doped with P-type impurities and a field effect transistor (FET) 202 is formed on the active region. The FET 202 includes a gate structure 203 and a source/drain region 204, 205. The gate structure 203 consists of a gate oxide layer 206, a doped polysilicon layer 207, a polycide layer 208 and a cap layer 209. The thickness of these layers are 100 Å, 1000 Å, 1000 Å and 1500 Å, respectively. The material of the polycide layer 208 and cap layer 209 are tungsten silicide ($WSi_x$) and silicon nitride ($SiN_x$). Additionally, a spacer 210 is formed on the sidewall of the gate structure 203. The formation of the spacer 210 includes the step of forming a nitride layer with a thickness about 1500 Å on the substrate and then etching back. An insulating layer 212 with a thickness about 2000 Å is formed by atmospheric pressure chemical vapor deposition (APCVD) to cover the source/drain region 204, 205 and transistor 203. The insulating layer 212 is then covered by an insulating layer 214. The insulating layer 214, including a material such as BPSG, is formed by both chemical vapor deposition (CVD) and a reflow process that is performed at a temperature of about 800° C., such that the thickness of the insulating layer 214 is about 7500 Å. The insulating layer 214 is then etched back to a thickness about 5000 Å to form an even surface.

Figure 2B:
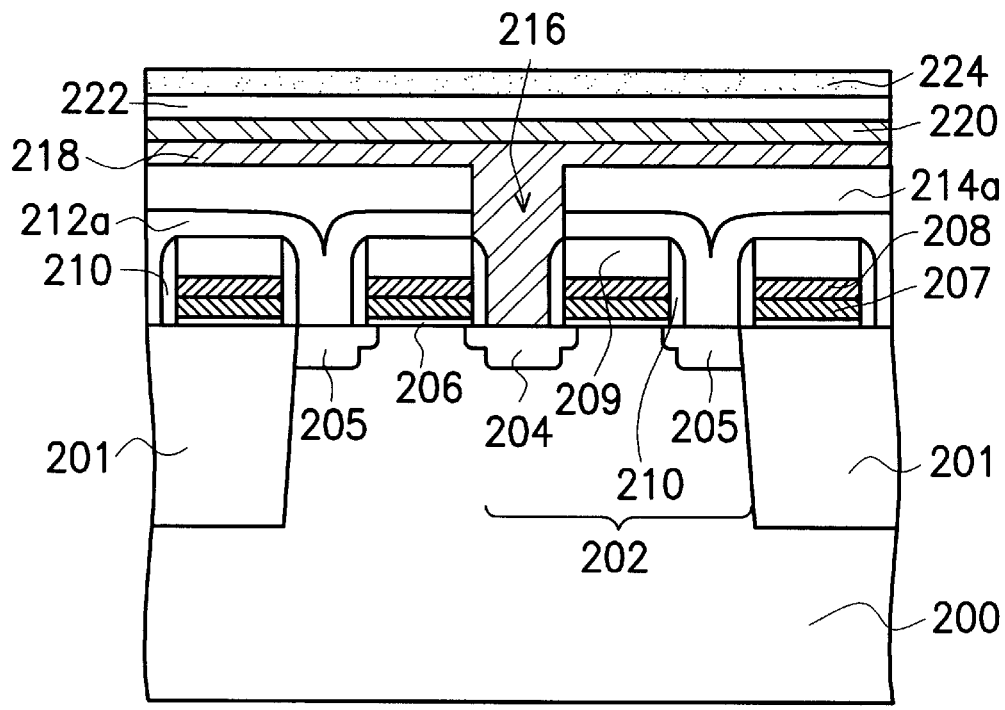

Referring to FIG. 2B, the insulating layers 212, 214 are patterned to form a bit-line contact window 216 to expose the source/drain region 204. A conductive layer 218 is formed with a thickness about 1000 Å to fill the bit-line contact window 216 and couple electrically with the source/drain region 204. A conductive layer 220, a cap layer 222 and a conductive layer 224 are then successively deposited on the conductive layer 218. Tungsten silicide is a preferred material for the conductive layer 220 with a thickness of about 1000 Å and LP-TEOS is selected for the cap layer 202 with a thickness of about 1000 Å. The preferred material of the conductive layer 224 is polysilicon and its thickness is about 1000 Å.

Figure 2C:
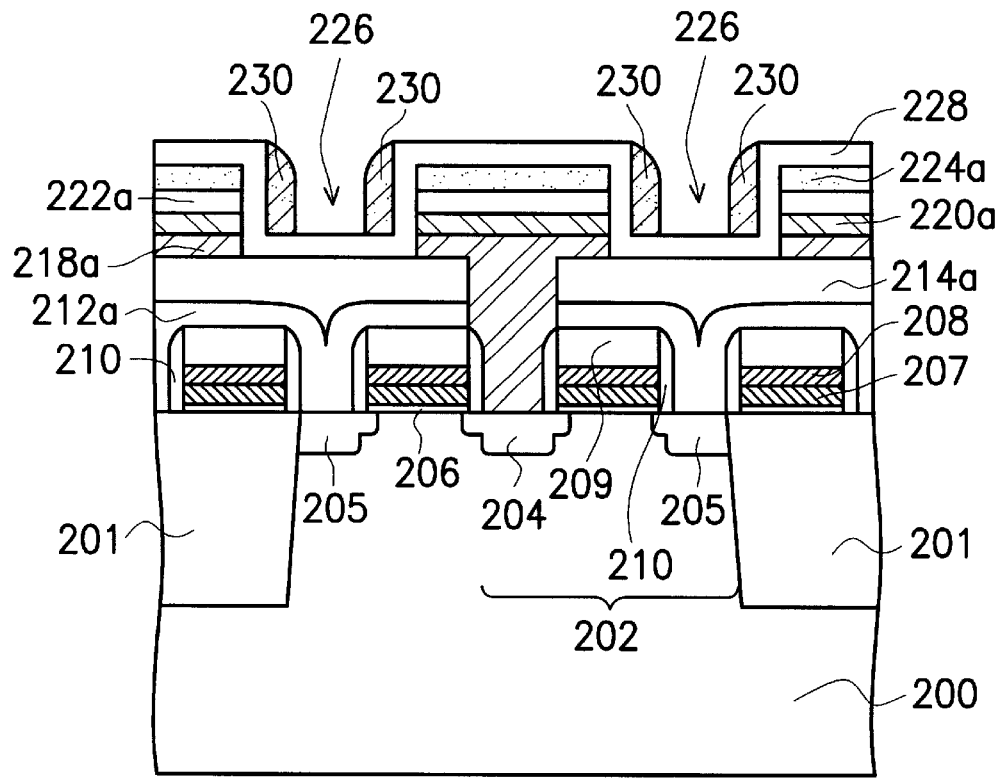

Referring to FIG. 2C, the conductive layer 224, the cap layer 222, and the conductive layers 220, 218 are defined by photolithography to form the conductive layer 224a, the cap layer 222a, and the conductive layers 220a, 218a, thus an opening 226 is formed.

Therefore, a bit line is formed from the conductive layers 218a, 220a and protected by the cap layer 222a formed thereon. The cap layer 222a is used to protect the bit line and serves as a stop layer in the definition process of the capacitor. In addition, the conductive layer 224a serves as an etching stop layer in the node contact process.

An insulating layer 228, such as LP-TEOS, is formed over the substrate with a thickness of about 500 Å. A conductive spacer 230 is formed on the sidewall of the opening 226 and its material includes doped polysilicon. The method of forming the conductive spacer 230 is to form a conductive layer to a thickness of about 1000 Å on the insulating layer 228 first and then etch back while using the insulating layer 228 as an etching stop layer.

Figure 2D:
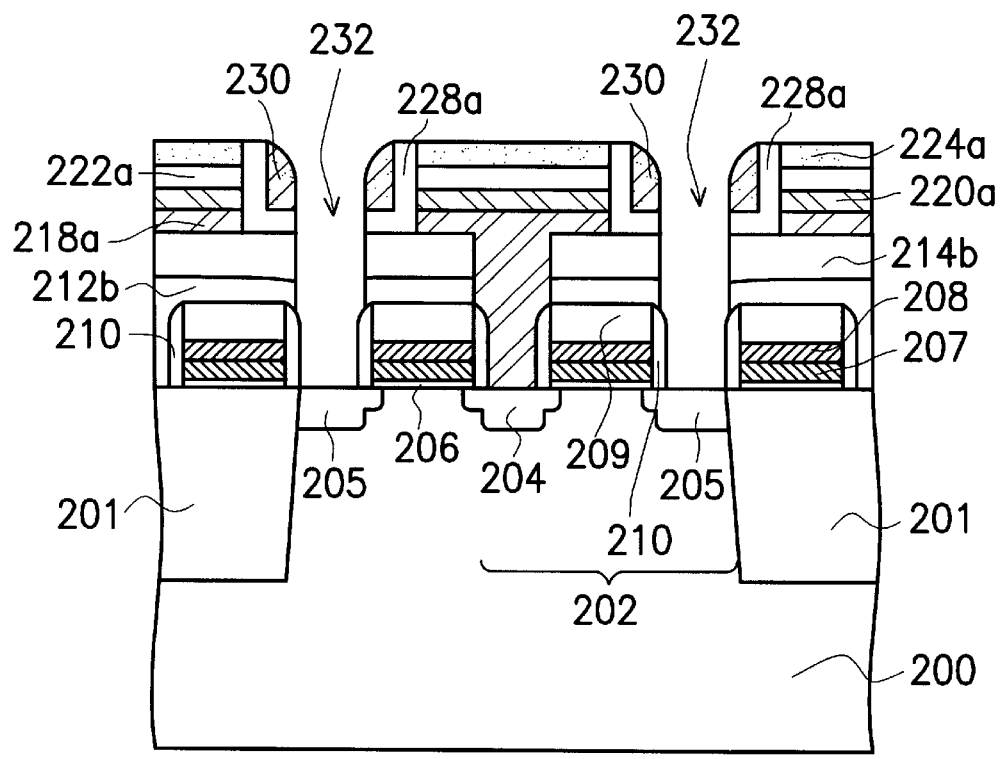

Referring to FIG. 2D, using the conductive spacer 230 and the conductive layer 224a formed on the bit line as a mask, an etching step to form a self-aligned contact is performed. The insulating layers 228, 214a, 212a are successively etched through to expose the source/drain region 205. A node contact window 232 is thus formed. The insulating layers 228 on the bit line are also etched away to form the insulating layer 228a, 214b, 212b.

The conductive layer 224a on the bit line, the conductive spacer 230, the cap layer 209 and the nitride spacer 210 of the gate structure 203 have different etching rates, although the self-aligned contact also can be formed in the etching step when the pattern of the contact window is misaligned. In addition, the bit line and the gate 203 are protected to prevent misalignment in photolithography.

The formation of a cap layer 222a on the bit line and a conductive spacer 230 formed on the sidewall of the cap layer 222a and the conductive layer 224a is one of the features in this invention. This feature can protect the bit line from etching in the sequential process and the self-aligned contact window can be formed without misalignment as the integration increases.

The process of forming a DRAM capacitor is then performed. The formation of the self-aligned contact window 232 is the most important and it can be applied to any structure of DRAM capacitor. Here is an example of a DRAM capacitor described in the following description.

Figure 2E:
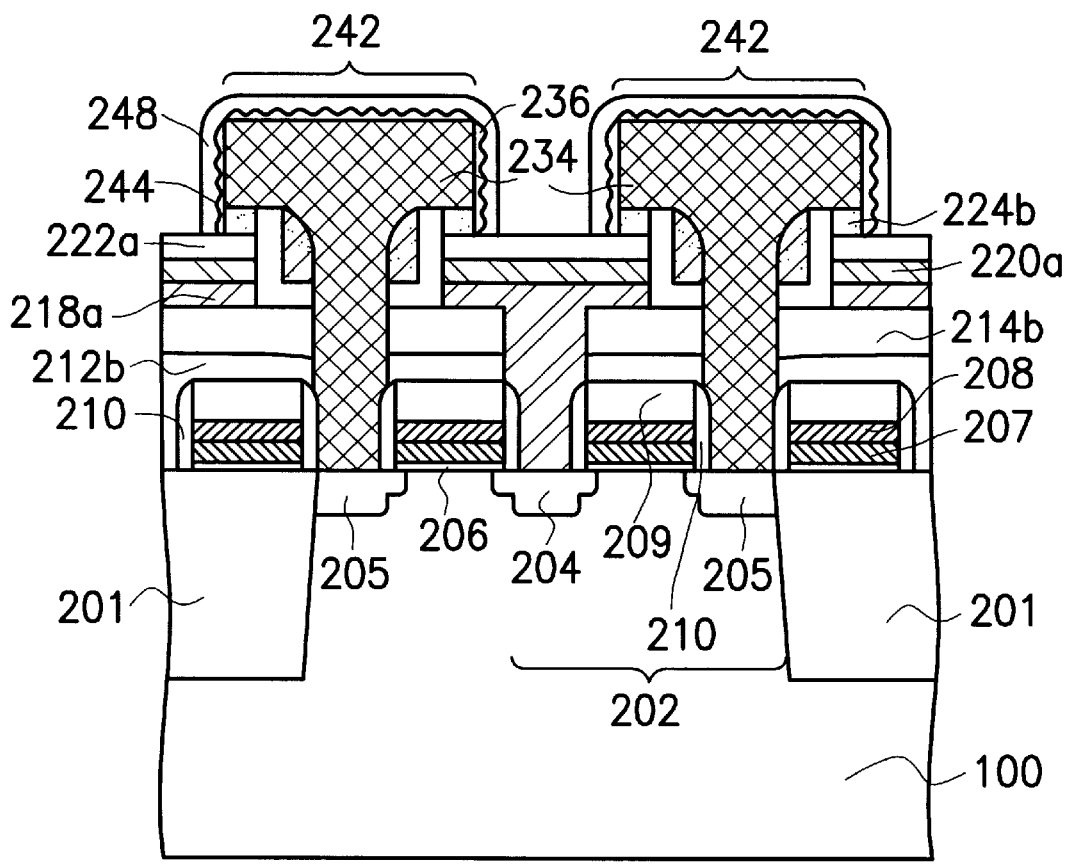

Referring to FIG. 2E, a conductive layer is formed and fills the node contact window 232 to couple electrically with the source/drain region 205. Doped polysilicon is usually used as the conductive layer and its thickness is about 8000 Å. The cap layer 222a serves as an etching stop layer and the lower electrode region is defined by photolithography to form the conductive layer 224a as a lower electrode. A portion of the conductive layer 224a is etched away since the material of the conductive layer 234 is the same as the rate of the conductive layer 224a formed on the bit line, so that the conductive layer 224b is formed. A hemispherical grained silicon (HSG) layer is grown selectively on the surface of the conductive layer 234, 224b to increase the surface area of the lower electrode.

A dielectric layer 244 with a thickness about 10–60 Å is formed on the exposed surface of the lower electrode. The dielectric layer can be a silicon oxide layer, a nitride-oxide (NO) layer, a oxide-nitride-oxide (ONO) layer or other dielectrics with high dielectric constants, such as $Ta_2O_5$, PZT or BST. A conductive layer 248 is formed on the dielectric layer 244 to serve as an upper electrode and the DRAM is complete.

The cap layer and the spacer of the gate, the conductive spacer and the conductive layer on the cap layer of the bit line are used to form a self-aligned contact window.

Therefore, the problem of photolithography can be overcome and this invention is suitable for high-density devices.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a self-aligned node contact window, wherein a substrate having a transistor is provided and the transistor includes a first source/drain region and a second source/drain region, the method comprising:

forming a bit line coupled electrically with the first source/drain region of the transistor, wherein the bit line has a sidewall, and a cap layer and a first conductive layer are formed on the bit line;

forming an insulating layer conformal to a structure comprising the bit line, the cap layer and the first conductive layer;

forming a conductive spacer on the insulating layer of the sidewall of the bit line, the cap layer and the first conductive layer; and forming the self-aligned node contact window by using the first conductive layer and the conductive spacer as a mask to perform an etching process to expose the second source/drain region.

2. The method according to claim 1, wherein the cap layer formed on the bit line includes LP-TEOS oxide.

3. The method according to claim 1, wherein the first conductive layer and the conductive spacer include doped polysilicon.

4. The method according to claim 1, wherein the insulating layer includes LP-TEOS oxide.

5. The method according to claim 1, wherein the thickness of the insulating layer is in a range of about 500 Å.

6. The method according to claim 1, wherein forming the conductive spacer further comprises:

forming a second conductive layer to cover the insulating layer; and performing an anisotropic etching process to remove a portion of the second conductive layer to form the conductive spacer.

7. A method of fabricating a self-aligned node contact window, in which a substrate having a transistor is provided, wherein the transistor includes a first cap layer, a first source/drain region and a second source/drain region, wherein the first cap layer is on a gate structure of the transistor, the first spacer is on the sidewall of the first cap layer and the gate structure, and the first source/drain region and the second source/drain region are in the substrate beside the gate structure, the method comprising:

forming a bit line coupled electrically with the first source/drain region of the transistor, wherein the bit line has a sidewall, and a second cap layer and a first conductive layer are formed on the bit line;

forming an insulating layer conformal with a structure comprising the bit line, the second cap layer and the first conductive layer;

forming a conductive spacer on the insulating layer of the sidewall of the bit line, the second cap layer and the first conductive layer; and forming the self-aligned node contact window by using the first conductive layer, the conductive spacer, the first cap layer of the transistor and the first spacer as a mask to perform an etching process to expose the second source/drain region of the transistor.

8. The method according to claim 7, wherein the cap layer formed on the bit line includes LP-TEOS oxide.

9. The method according to claim 7, wherein the first conductive layer and the conductive spacer include doped polysilicon.

10. The method according to claim 7, wherein the insulating layer includes LP-TEOS oxide.

11. The method according to claim 7, wherein the thickness of the insulating layer is in a range of about 500 Å.

12. The method according to claim 7, wherein forming the conductive spacer further comprises:

forming a second conductive layer to cover the insulating layer; and performing an anisotropic etching process to remove a portion of the second conductive layer to form the conductive spacer.

13. A method of fabricating a DRAM capacitor, wherein a substrate having a transistor is provided and the transistor includes a first source/drain region and a second source/drain region, the method comprising:

forming a bit line coupled electrically with the first source/drain region of the transistor, wherein a cap layer and a first conductive layer are formed on the bit line;

forming an insulating layer conformal with a structure comprising the bit line, the cap layer and the first conductive layer;

forming a conductive spacer on the insulating layer of the sidewall of the bit line, the cap layer and the first conductive layer;

forming the self-aligned node contact window by using the first conductive layer and the conductive spacer as a mask to perform an etching process to expose the second source/drain region;

forming a second conductive layer to fill the node contact window;

patterning the second conductive layer to form a lower electrode of the capacitor, and forming a dielectric layer and an upper electrode on the lower electrode to accomplish the DRAM capacitor.

* * * * *